United States Patent
Hsu et al.

(10) Patent No.: US 10,658,286 B2
(45) Date of Patent: May 19, 2020

(54) METAL-OXIDE-METAL CAPACITOR WITH EMBEDDED ROUTING

(71) Applicant: Nuvoton Technology Corporation, Hsinchu (TW)

(72) Inventors: Fu-Sheng Hsu, Hsinchu (TW); Ming-Chun Liang, Hsinchu (TW)

(73) Assignee: Nuvoton Technology Corporation, Hsinchu (TW)

( * ) Notice: Subject to any disclaimer, the term of this patent is extended or adjusted under 35 U.S.C. 154(b) by 0 days.

(21) Appl. No.: 16/153,850

(22) Filed: Oct. 8, 2018

(65) Prior Publication Data

US 2020/0111735 A1    Apr. 9, 2020

(51) Int. Cl.
*H01L 23/522*    (2006.01)
*H01L 49/02*    (2006.01)

(52) U.S. Cl.
CPC .......... *H01L 23/5223* (2013.01); *H01L 28/60* (2013.01)

(58) Field of Classification Search
CPC .................. H01L 23/5223; H01L 28/60
See application file for complete search history.

(56) References Cited

U.S. PATENT DOCUMENTS

| | | | | |
|---|---|---|---|---|
| 8,970,002 B2* | 3/2015 | Sutardja | ................ | H01G 4/005 257/532 |
| 2008/0001255 A1* | 1/2008 | Okuda | ................ | H01L 23/5223 257/532 |
| 2010/0038752 A1* | 2/2010 | Ng | ........................ | H01G 4/005 257/532 |
| 2010/0309605 A1* | 12/2010 | Lin | ..................... | H01L 23/5223 361/306.3 |
| 2014/0008762 A1* | 1/2014 | Cheng | ................ | H01L 23/5223 257/532 |
| 2018/0308847 A1* | 10/2018 | Lu | .......................... | H01L 28/60 |

* cited by examiner

*Primary Examiner* — Fernando L Toledo
*Assistant Examiner* — Neil R Prasad
(74) *Attorney, Agent, or Firm* — Litron Patent & Trademark Office; Min-Lee Teng

(57) ABSTRACT

A capacitor cell for a semiconductor device, wherein the capacitor cell comprises: a capacitor having a first node and a second node; a first electrode structure, comprising a first contact point and a second contact point, wherein the first contact point and the second contact point are electrically connected to the first node of said capacitor and located at two different edges of the capacitor cell; and a second electrode structure, comprising a third contact point and a fourth contact point, wherein the third contact point and the fourth contact point are electrically connected to the second node of said capacitor and located at said two different edges of the capacitor cell.

20 Claims, 6 Drawing Sheets

METAL-OXIDE-METAL CAPACITOR WITH EMBEDDED ROUTING

BACKGROUND OF THE INVENTION

1. Field of the Invention

The present invention relates generally to a capacitor cell design, and more particularly, to a Metal-Oxide-Metal (MOM) capacitor cell design.

2. Description of the Prior Art

In advanced CMOS processes, multiple Metal-Oxide-Metal capacitor cells are used to form a larger capacitor for increasing the overall capacitance. Multiple Metal-Oxide-Metal capacitor cells of the same design are placed in a region and electrically connected through routing wires placed between the Metal-Oxide-Metal capacitor cells for forming a larger capacitor with higher capacitance. However, the routing wires placed between the Metal-Oxide-Metal capacitor cells will not only introduce stray capacitance but also increase the layout area of the larger capacitor.

In a conventional vertical MOM capacitor as shown in FIG. 1, a well is formed by two electrodes 110, 120 in each meal layer, wherein dielectric material can be disposed between side walls of the two electrodes 110, 120 to form a capacitor. A high-density MOM capacitor can be made by electrically connecting multiple metal layers 101, 102, 103, 104 through via 130. Then, multiple of the same vertical MOM capacitor cell can be placed nearby for forming a capacitor bank. However, in order to electrically connect the multiple MOM capacitor cells, as shown in FIG. 2, the multiple MOM capacitors 201, 202, 203, 204 cell need to be spaced apart for placing routing wires 210, 220 for electrically connecting the multiple MOM capacitor cells 201, 202, 203, 204, which not only increases the layout area of the capacitor bank but also results in stray capacitance.

Therefore, what is needed is a new way to design a capacitor cell to overcome the above-mentioned issues.

SUMMARY OF THE INVENTION

One objective of present invention is to provide a capacitor cell with in-cell routing wires so that multiple capacitor cells can be placed side by side and electrically connected to each other without having routing wires placed between each two adjacent capacitor cells, thereby decreasing the overall area of the multiple capacitor cells for forming a larger capacitor with higher capacitance and making the stray capacitance of each capacitor cell deterministic for increasing the capacitance matching degree between the multiple capacitor cells.

One embodiment of the present invention discloses a capacitor cell for a semiconductor device, said capacitor cell comprising: a capacitor having a first node and a second node; a first electrode structure, comprising a first contact point and a second contact point, wherein the first contact point and the second contact point are electrically connected to the first node of said capacitor and located at two different edges of the capacitor cell; and a second electrode structure, comprising a third contact point and a fourth contact point, wherein the third contact point and the fourth contact point are electrically connected to the second node of said capacitor and located at said two different edges of the capacitor cell.

In one embodiment, the third contact point and the fourth contact point of the second electrode structure are formed by a first metal layer of the capacitor cell, wherein the second electrode structure comprises a first conductive wire that is formed by the first metal layer and electrically connects the third contact point to the fourth contact point.

In one embodiment, the first conductive wire of the second electrode structure encompasses the center of a first edge and the center of a second edge of the capacitor cell, wherein the first edge and the second edge are two adjacent edges of the capacitor cell. In one embodiment, the first conductive wire of the second electrode structure has an L shape.

In one embodiment, the first contact point and the second contact point of the first electrode structure are formed by the first metal layer, wherein the first electrode structure comprises a second conductive wire that is formed by the first metal layer and electrically connects the first contact point to the second contact point. In one embodiment, the second conductive wire of the first electrode structure encompasses three corners of the capacitor cell and has an L shape.

In one embodiment, the first electrode structure further comprises a fifth contact point formed by the first metal layer, wherein the fifth contact point is electrically connected to the first node of the capacitor, wherein the fifth contact point is encompassed in a conductive region at a corner of the capacitor cell other than said three corners and is not electrically connected to the said second conductive wire by the first metal layer itself.

In one embodiment, the capacitor is based on a Metal-Oxide-Metal (MOM) structure.

In one embodiment, the capacitor is based on a Metal-Oxide-Metal (MOM) structure, and the capacitor cell has a substantially square shape.

In one embodiment, the capacitor cell is based on a CMOS process.

In one embodiment, all of said contact points are formed by the top metal layer of the capacitor cell.

In one embodiment, all of said contact points are made of copper.

In one embodiment, all of said contact points are made of gold.

In one embodiment, said third contact point and said fourth contact point are formed by the top metal layer of the capacitor cell, and said first contact point and said second contact point are formed by a metal layer under the top metal layer of the capacitor cell.

In one embodiment, said first contact point and said second contact point are formed by the top metal layer of the capacitor cell, and said third contact point and said fourth contact point are formed by a metal layer under the top metal layer of the capacitor cell.

One embodiment of the present invention discloses a semiconductor device, comprising: a plurality of capacitor cells, wherein each of the plurality of capacitor cells are placed side by side, wherein for each two adjacent capacitor cells, said two adjacent capacitor cells are electrically connected through corresponding contact points of said two adjacent capacitor cells without having any routing wires being placed between said two adjacent capacitor cells.

In one embodiment, the semiconductor device is based on a CMOS process.

BRIEF DESCRIPTION OF DRAWINGS

The foregoing aspects and many of the accompanying advantages of this invention will become more readily appreciated as the same becomes better understood by reference to the following detailed description, when taken in conjunction with the accompanying drawings, wherein.

DETAILED DESCRIPTION OF EMBODIMENTS

The detailed explanation of the present invention is described as follows. The described preferred embodiments are presented for purposes of illustrations and description, and they are not intended to limit the scope of the present invention.

Figure 1:
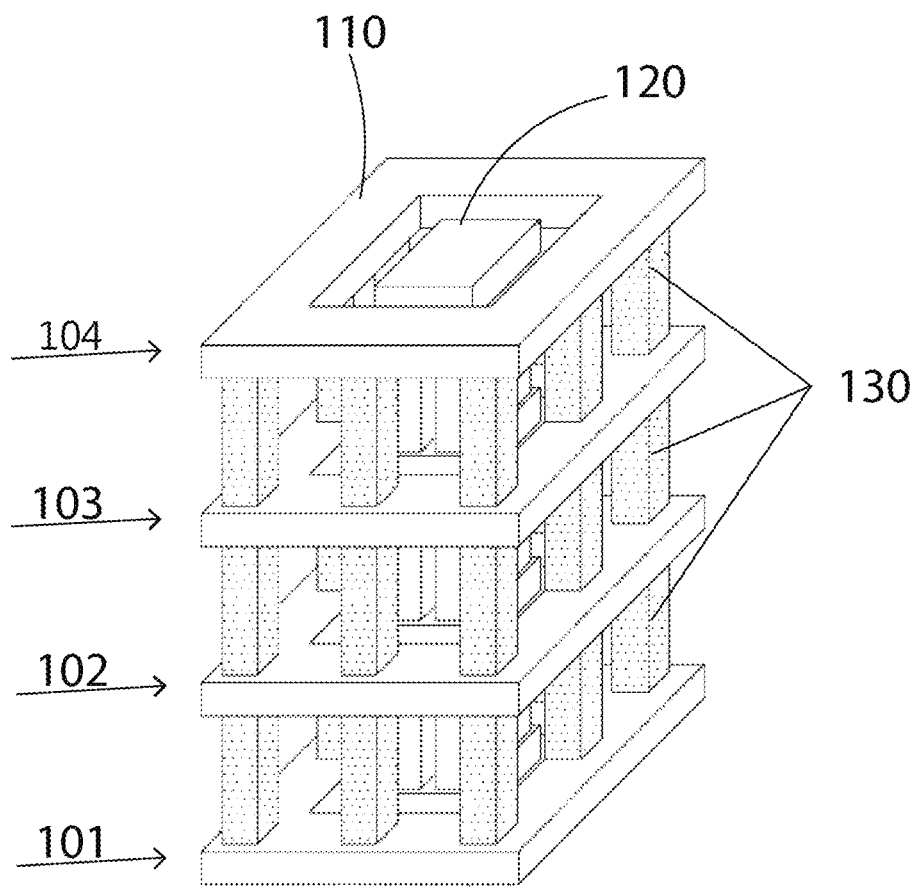
FIG. 1 illustrates a conventional vertical MOM capacitor.
Figure 2:
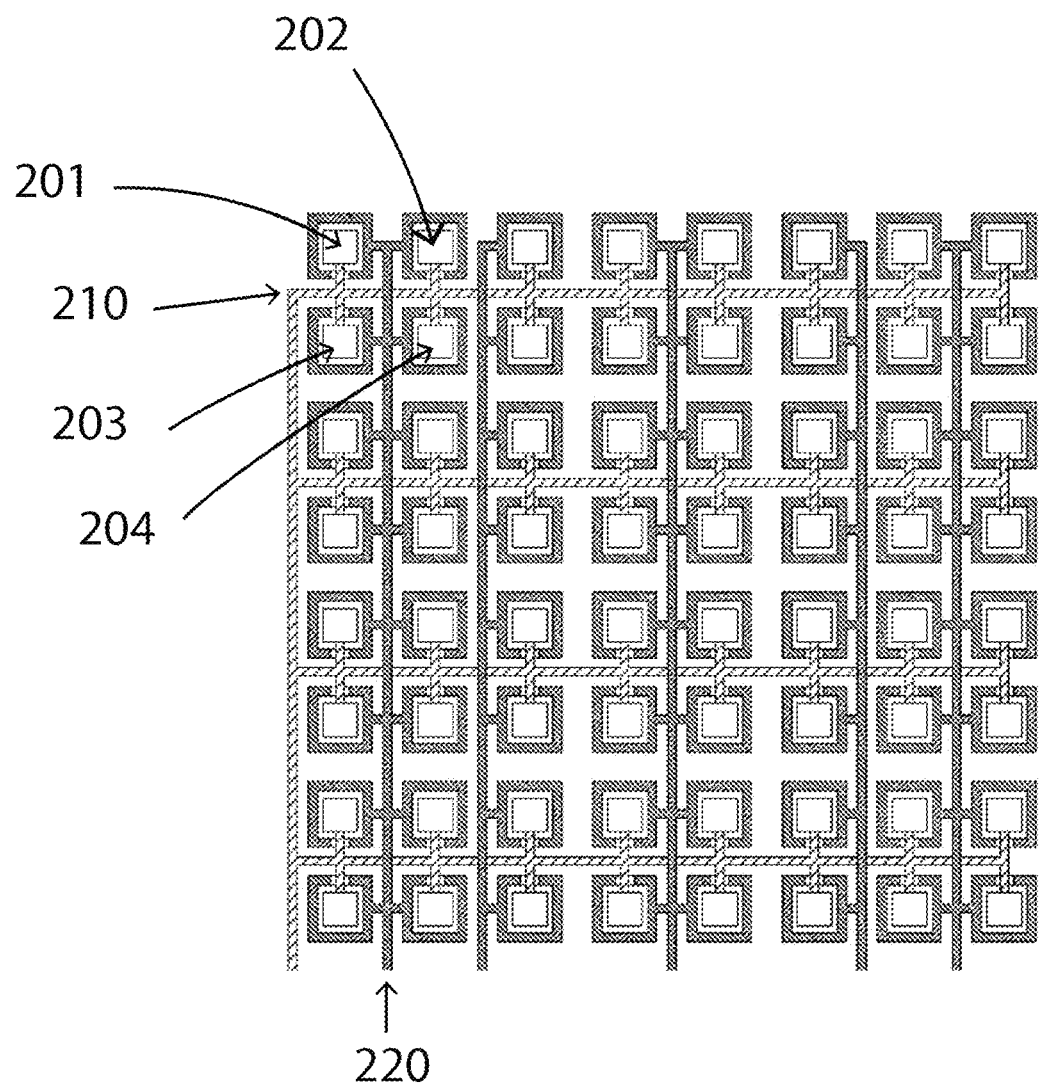
FIG. 2 illustrates the routing wires between the multiple MOM capacitor cells in a conventional capacitor bank.
Figure 3:
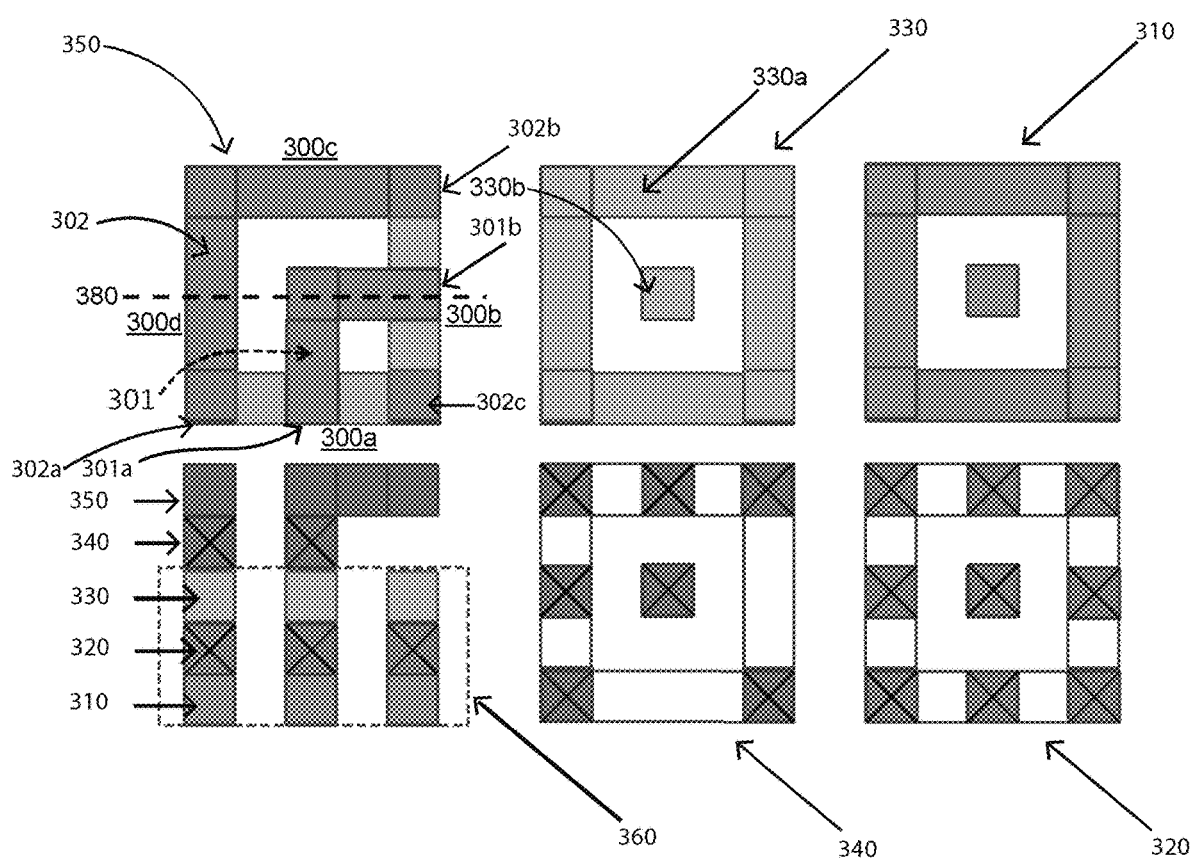
FIG. 3 illustrates a capacitor cell for a semiconductor device in accordance with one embodiment of this invention.

FIG. 3 illustrates an exploded view of one example of a capacitor cell for a semiconductor device, wherein the capacitor cell comprises a first metal layer 310, a second metal layer 330 and a third metal layer 350, wherein a capacitor 360 comprises the first metal layer 310 and the second metal layer 330 electrically connected to the first metal layer 310 through a via layer 320, wherein the second metal layer 330 of the capacitor 360 comprises a first node 330a and a second node 330b. The third metal layer 350 comprises a first electrode structure 302 and a second electrode structure 301 of the capacitor cell, wherein the first electrode structure 302 and the second electrode structure 301 of the capacitor cell are respectively electrically connected to the first node 330a and the second node 330b of the capacitor 360 through a via layer 340. The first electrode structure 302 comprises a first contact point 302a and a second contact point 302b at two different edges 300a, 300b of the capacitor cell; and the second electrode structure 301 comprises a third contact point 301a and a fourth contact point 301b at said two different edges 300a, 300b of the capacitor cell.

In one embodiment, the capacitor 360 is based on a Metal-Oxide-Metal (MOM) structure.

In one embodiment, the capacitor cell has a substantially square shape, and the capacitor cell has four edges 300a, 300b, 300c, 300d, which can be visualized by looking at the third metal layer 350 in FIG. 3, wherein line 380 passes through the center of the edge 300b and the center of the edge 300d.

In one embodiment, the first contact point 302a and the second contact point 302b are electrically connected by a conductive wire formed by the third metal layer 350, wherein said conductive wire can include multiple line strips each having a suitable width. In one embodiment, the first contact point 302a and the second contact point 302b are formed by a metal layer other than the third metal layer 350.

In one embodiment, the conductive wire of the first electrode structure 302 encompasses three corners of the capacitor cell and has an L shape, as shown in the third metal layer 350 of FIG. 3. In one embodiment, the first electrode structure 302 further comprises a fifth contact point formed by the third metal layer 350, wherein the fifth contact point is electrically connected to the first node 330a of the capacitor 360, wherein the fifth contact point is encompassed in a conductive region 302c at a corner of the capacitor cell, as shown in the third metal layer 350 of FIG. 3.

In one embodiment, the third contact point 301a and the fourth contact point 301b are electrically connected by a conductive wire formed by the third metal layer 350, wherein said conductive wire can include multiple line strips each having a suitable width. In one embodiment, the third contact point 301a and the fourth contact point 301b are formed by a metal layer other than the third metal layer 350. In one embodiment, the conductive wire of the second electrode structure 301 encompasses the center of a first edge 300a and the center of a second edge 300b of the capacitor cell, wherein the first edge 300a and the second edge 300b are two adjacent edges of the capacitor cell, as shown in the third metal layer 350 of FIG. 3. In one embodiment, the conductive wire of the second electrode structure 301 has an L shape, as shown in the third metal layer 350 of FIG. 3.

In one embodiment, the first contact point 302a, the second contact point 302b, the third contact point 301a, and the fourth contact point 301b are formed by the top metal layer of the capacitor cell.

In one embodiment, the first contact point 302a and the second contact point 302b are formed by the top metal layer of the capacitor cell, and the third contact point 301a and the fourth contact point 301b are formed by a metal layer under the top metal layer of the capacitor cell.

In one embodiment, the third contact point 301a and the fourth contact point 301b are formed by the top metal layer of the capacitor cell, and the first contact point 302a and the second contact point 302b are formed by a metal layer under the top metal layer of the capacitor cell.

In one embodiment, the capacitor cell is based on a CMOS process.

Figure 4:
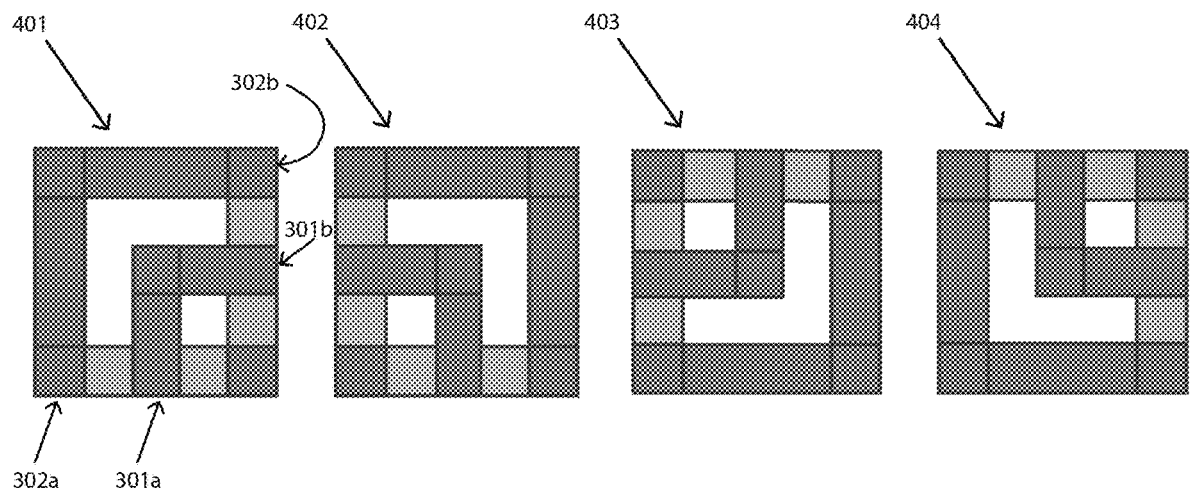
FIG. 4 illustrates different orientations of the capacitor cell in accordance with one embodiment of this invention.

FIG. 4 illustrates different orientations of the capacitor cell in FIG. 3, wherein a second orientation 402 is rotated 90° from a first orientation 401; a third orientation 403 is rotated 180° from the first orientation 401; and a fourth orientation 404 is rotated 270° from the first orientation 401. When multiple capacitor cells are placed side by side, each capacitor cell can be in any one of the orientations 401, 402, 403, 404 such that each two adjacent capacitor cells can be electrically connected through the corresponding contact points thereof without having any routing wires being placed between each two adjacent capacitor cells.

Figure 5:
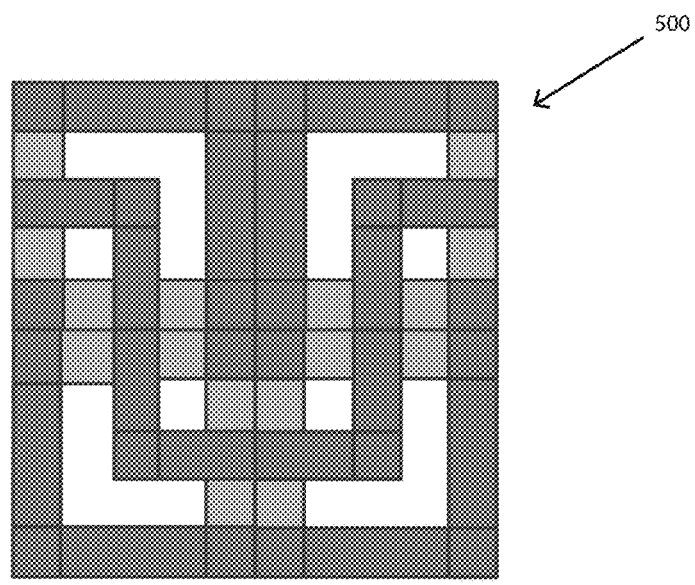
FIG. 5 illustrates an example to connect four capacitor cells in accordance with one embodiment of this invention.

FIG. 5 illustrates one example to connect multiple capacitor cells, wherein four capacitor cells are connected for forming a larger capacitor 500 with four times of the capacitance of a single capacitor cell, wherein each capacitor cell can be in a suitable one of the orientations shown in FIG. 4 such that each two adjacent capacitor cells can be electrically connected through the corresponding contact points thereof without having any routing wires being placed between each two adjacent capacitor cells. By connecting the capacitor cells this way, there will be no stray capacitance introduced by rotating wires placed between each two adjacent capacitor cells, and the overall capacitance of the larger capacitor 500 can be designed within a smaller tolerance compared with the conventional way having routing wires placed between each two adjacent capacitor cells, because the stray capacitance introduced by the routing wires placed between each two adjacent capacitor cells is dependent on a particular layout of a circuit design, and hence making it much more complex to evaluate the overall capacitance of the larger capacitor 500, if it is formed by using a conventional way.

Figure 6:
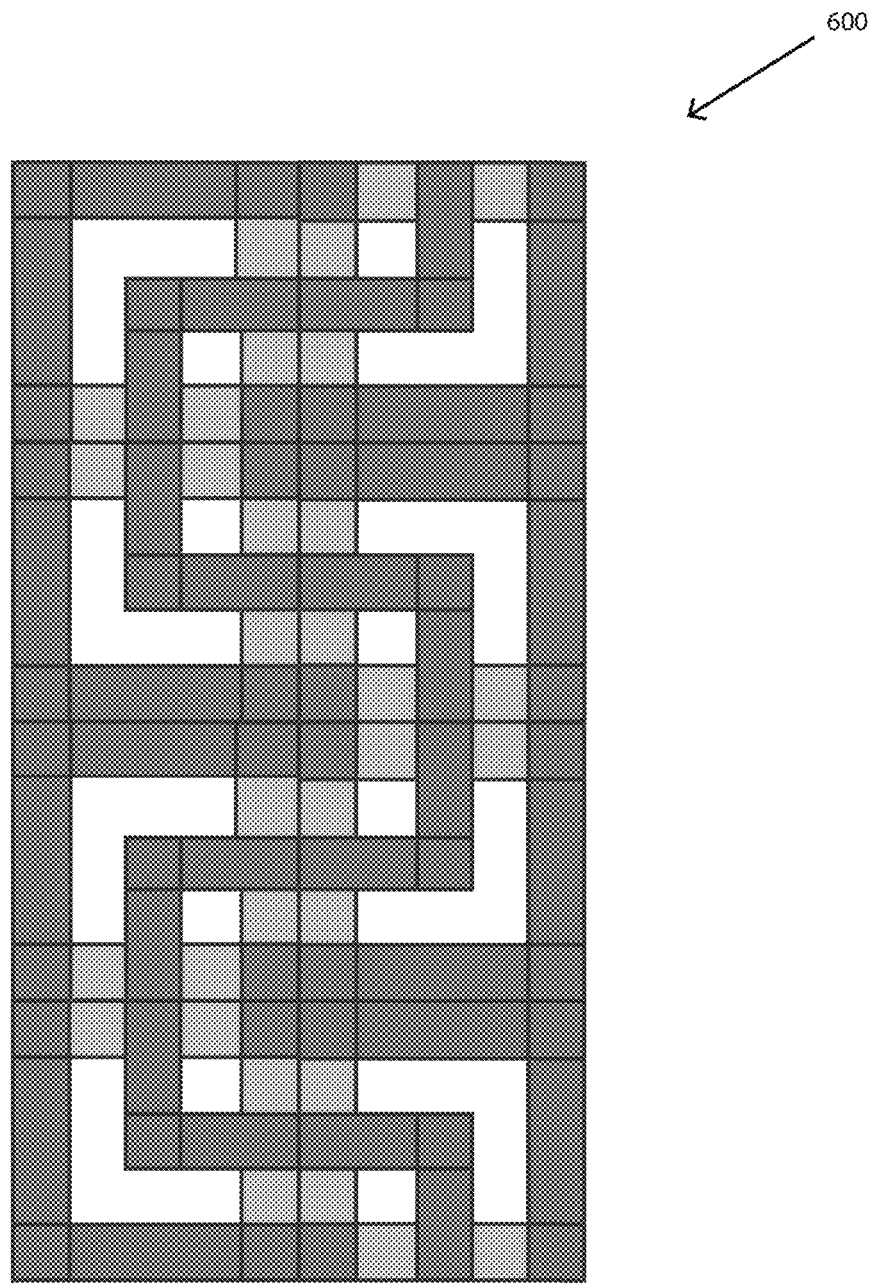
FIG. 6 illustrates an example to connect eight capacitor cells in accordance with one embodiment of this invention.

FIG. 6 illustrates one example to connect multiple capacitor cells, wherein eight capacitor cells are connected for forming a larger capacitor 600 with eight times of the capacitance of a single capacitor cell, wherein each capacitor cell can be in a suitable one of the orientations shown in FIG. 4 such that each two adjacent capacitor cells can be electrically connected through the corresponding contact points thereof without having any routing wires being placed between each two adjacent capacitor cells. By connecting the capacitor cells this way, there will be no stray capacitance introduced by rotating wires placed between two adjacent capacitor cells, and the overall capacitance of the larger capacitor 600 can be designed within a smaller tolerance compared with the conventional way having routing wires placed between each two adjacent capacitor cells, because the stray capacitance introduced by the routing wires placed between each two adjacent capacitor cells is dependent on a particular layout of a circuit design, and hence making it much more complex to evaluate the overall capacitance of the larger capacitor 600, if it is formed by using a conventional way.

Figure 7:
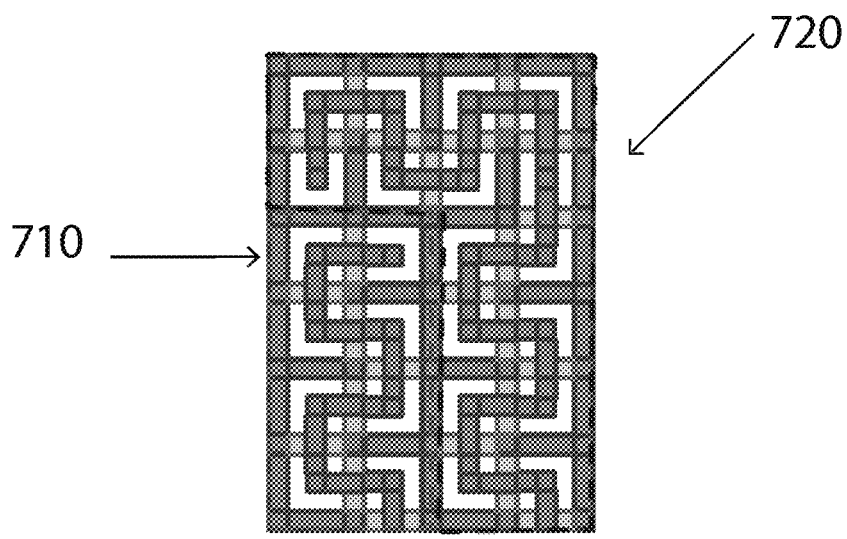
FIG. 7 illustrates an example to connect two group of eight and sixteen capacitor cells in accordance with one embodiment of this invention.

FIG. 7 illustrates one example to connect multiple capacitor cells, wherein one group of eight capacitor cells 710 are connected for forming a larger capacitor with eight times of the capacitance of a single capacitor cell, and another group of sixteen capacitor cells 720 are connected for forming a larger capacitor with sixteen times of the capacitance of a single capacitor cell. In the group of eight capacitor cells 710, each capacitor cell can be in a suitable one of the orientations shown in FIG. 4 such that each two adjacent capacitor cells can be electrically connected through the corresponding contact points thereof without having any routing wires being placed between each two adjacent capacitor cells. In the group of sixteen capacitor cells 720, each capacitor cell can be in a suitable one of the orientations shown in 4 such that each two adjacent capacitor cells can be electrically connected through the corresponding contact points thereof without having any routing wires being placed between each two adjacent capacitor cells. By connecting the capacitor cells this way, there will be no stray capacitance introduced by rotating wires placed between two adjacent capacitor cells, and the overall capacitance of the each group of the capacitor cells 710, 720 can be designed within a smaller tolerance compared with the conventional way having routing wires placed between each two adjacent capacitor cells, because the stray capacitance introduced by the routing wires placed between each two adjacent capacitor cells is dependent on a particular layout of a circuit design, and hence making it much more complex to evaluate the overall capacitance of each group of the capacitor cells 710, 720, if they are formed by using a conventional way.

Figure 8:
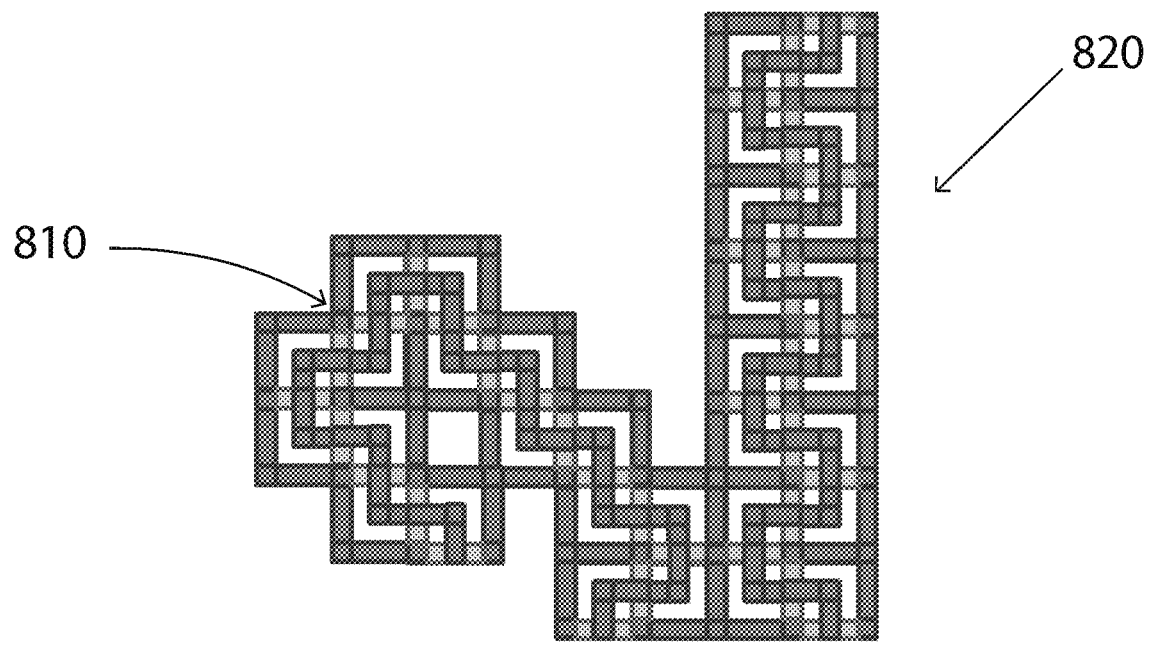
FIG. 8 illustrates an example to connect two group of sixteen capacitor cells in accordance with one embodiment of this invention.

FIG. 8 illustrates another example to connect multiple capacitor cell for forming a larger capacitor with higher capacitance. As shown in FIG. 8, one group of sixteen capacitor cells 810 are connected for forming a larger capacitor with sixteen times of the capacitance of a single capacitor cell, and another group of sixteen capacitor cells 820 are connected for forming a larger capacitor with sixteen times of the capacitance of a single capacitor cell. In the group of sixteen capacitor cells 810, each capacitor cell can be in a suitable one of the orientations shown in FIG. 4 such that each two adjacent capacitor cells can be electrically connected through the corresponding contact points thereof without having any routing wires being placed between each two adjacent capacitor cells. In the group of sixteen capacitor cells 820, each capacitor cell can be in a suitable one of the orientations shown in FIG. 4 such that each two adjacent capacitor cells can be electrically connected through the corresponding contact points thereof without having any routing wires being placed between each two adjacent capacitor cells. By connecting the capacitor cells this way, there will be no stray capacitance introduced by rotating wires placed between two adjacent capacitor cells, and the overall capacitance of the each group of the capacitor cells 810, 820 can be designed within a smaller tolerance compared with the conventional way having routing wires placed between each two adjacent capacitor cells, because the stray capacitance introduced by the routing wires placed between each two adjacent capacitor cells is dependent on a particular layout of a circuit design, and hence making it much more complex to evaluate the overall capacitance of each group of the capacitor cells 810, 820, if they are formed by using a conventional way.

In another embodiment, the first electrode structure 302 comprises a conductor wire along the fourth edge 300d and extended from the first edge 300a to the third edge 300c; and the second electrode structure 301 comprises a conductor wire extending from the first edge 300a to the third edge 300c and encompassing the center of the first edge 300a and the center of the third edge 300c, wherein the first edge 300a and the third edge 300c are two opposite edges of the capacitor cell, wherein each of the first electrode structure 302 and the second electrode structure 301 has one contact point at the first edge 300a and another contact point at the third edge 300c, respectively, for connecting with an adjacent capacitor cell.

The foregoing descriptions of specific embodiments of the present invention have been presented for purposes of illustrations and description. They are not intended to be exclusive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to particular use contemplated. It is intended that the scope of the invention be defined by the claims appended hereto and their equivalents.

What is claimed is:

1. A capacitor cell for a semiconductor device, said capacitor cell comprising:
   a capacitor having a first node and a second node;
   a first electrode structure, comprising a first contact point and a second contact point, wherein the first contact point and the second contact point are electrically connected to the first node of said capacitor, wherein the first contact point is encompassed in a first conductive region at a first corner of the capacitor cell, and the second contact point is encompassed in a second conductive region at a second corner of the capacitor cell; and
   a second electrode structure, comprising a third contact point and a fourth contact point, wherein the third contact point and the fourth contact point are electrically connected to the second node of said capacitor, wherein the first contact point and the third contact point are located at a first edge of the capacitor cell, and the second contact point and the fourth contact point are located at a second edge of the capacitor cell.

2. The capacitor cell of claim 1, wherein the third contact point and the fourth contact point are formed by a first metal layer of the capacitor cell, wherein the second electrode structure comprises a first conductive wire that is formed by the first metal layer and electrically connects the third contact point to the fourth contact point.

3. The capacitor cell of claim 1, wherein the third contact point and the fourth contact point are formed by a first metal layer, wherein the second electrode structure comprises a first conductive wire that is formed by a second metal layer and electrically connects the third contact point to the fourth contact point, wherein the first metal layer and the second metal layer are two different metal layers of the capacitor cell.

4. The capacitor cell of claim 2, wherein said first conductive wire encompasses the center of the first edge and the center of the second edge of the capacitor cell, wherein the first edge and the second edge are two adjacent edges of the capacitor cell.

5. The capacitor cell of claim 4, wherein said first conductive wire has an L shape.

6. The capacitor cell of claim 2, wherein said first conductive wire encompasses the center of the first edge and the center of the second edge, wherein the first edge and the second edge are two opposite edges of the capacitor cell.

7. The capacitor cell of claim 6, wherein said first conductive wire comprises a straight-line strip.

8. The capacitor cell of claim 2, wherein the first contact point and the second contact point are formed by the first metal layer, wherein the first electrode structure comprises a second conductive wire that is formed by the first metal layer and electrically connects the first contact point to the second contact point.

9. The capacitor cell of claim 8, wherein said second conductive wire encompasses the first corner, the second corner and a third corner of the capacitor cell and has an L shape, wherein the third corner is located between the first corner and the second corner.

10. The capacitor cell of claim 9, wherein the first electrode structure further comprises a fifth contact point formed by the first metal layer, wherein the fifth contact point is electrically connected to the first node of the capacitor, wherein the fifth contact point is encompassed in a conductive region at a corner of the capacitor cell other than said three corners and is not electrically connected to the said second conductive wire by the first metal layer itself.

11. The capacitor cell of claim 1, wherein the capacitor is based on a Metal-Oxide-Metal (MOM) structure.

12. The capacitor cell of claim 1, wherein the capacitor is based on a Metal-Oxide-Metal (MOM) structure, and the capacitor cell has a substantially square shape.

13. The capacitor cell of claim 1, wherein the capacitor cell is based on a CMOS process.

14. The capacitor cell of claim 1, wherein all of said contact points are formed by the top metal layer of the capacitor cell.

15. The capacitor cell of claim 14, wherein all of said contact points are made of copper.

16. The capacitor cell of claim 14, wherein all of said contact points are made of gold.

17. The capacitor cell of claim 1, wherein said third contact point and said fourth contact point are formed by the top metal layer of the capacitor cell, and said first contact point and said second contact point are formed by a metal layer under the top metal layer of the capacitor cell.

18. The capacitor cell of claim 1, wherein said first contact point and said second contact point are formed by the top metal layer of the capacitor cell, and said third contact point and said fourth contact point are formed by a metal layer under the top metal layer of the capacitor cell.

19. A semiconductor device, comprising:
a plurality of capacitor cells, wherein each of the plurality of capacitor cells is recited as in claim 1, wherein the plurality of capacitor cells are placed side by side, wherein for each two adjacent capacitor cells, said two adjacent capacitor cells are electrically connected through the corresponding contact points of said two adjacent capacitor cells without having any routing wires being placed between said two adjacent capacitor cells.

20. The semiconductor device of claim 19, wherein the semiconductor device is based on a CMOS process.

* * * * *